United States Patent
Jo et al.

(10) Patent No.: US 12,176,852 B2
(45) Date of Patent: Dec. 24, 2024

(54) VOLTAGE SETTING CIRCUIT, SEMICONDUCTOR INTEGRATED CIRCUIT AND VOLTAGE SETTING METHOD

(71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 18/264,567

(22) PCT Filed: Feb. 18, 2021

(86) PCT No.: PCT/JP2021/006157
§ 371 (c)(1),
(2) Date: Aug. 7, 2023

(87) PCT Pub. No.: WO2022/176115
PCT Pub. Date: Aug. 25, 2022

(65) Prior Publication Data
US 2024/0056029 A1    Feb. 15, 2024

(51) Int. Cl.
*H03B 5/04*    (2006.01)

(52) U.S. Cl.
CPC ....... *H03B 5/04* (2013.01); *H03B 2200/0062* (2013.01); *H03B 2200/0088* (2013.01)

(58) Field of Classification Search
CPC .......................................... H03B 5/04
USPC ..................................... 331/108 R
See application file for complete search history.

(56) References Cited

U.S. PATENT DOCUMENTS

2009/0296192 A1* 12/2009 Morishita ............. G02F 1/0123
359/288
2020/0393706 A1* 12/2020 Vera Villarroel ... H03F 3/45973

OTHER PUBLICATIONS

Jyo et al., "A 241-GHz-Bandwidth Distributed Amplifier with 10-dBm P1dB in 0.25-μm InP DHBT Technology," 2019 IEEE/MTT-S International Microwave Symposium Jun. 2, 2019, pp. 1430-1433. As discussed in the specification.
Jyo et al., "A DC to 194-GHz Distributed Mixer in 250-nm InPDHBT Technology," 2020 IEEE/MTT-S InternationalMicrowave Symposium, Aug. 4, 2020, pp. 771-774. As discussed in the specification.

* cited by examiner

*Primary Examiner* — Joseph Chang
(74) *Attorney, Agent, or Firm* — Slater Matsil, LLP

(57) ABSTRACT

A voltage setting circuit includes a frequency comparator that compares the oscillation frequencies of a first distributed voltage-controlled oscillator and a second distributed voltage-controlled oscillator and a frequency determination circuit that determines the levels of the oscillation frequencies of the first distributed voltage-controlled oscillator and the second distributed voltage-controlled oscillator. The bias to be supplied to the first distributed voltage-controlled oscillator and the bias to be supplied to the second distributed voltage-controlled oscillator are determined in accordance with a result of the determination. The bias at a time when the levels of the oscillation frequencies are reversed is determined to be the optimum bias, and the optimum bias is supplied to the core circuit.

16 Claims, 12 Drawing Sheets

VOLTAGE SETTING CIRCUIT, SEMICONDUCTOR INTEGRATED CIRCUIT AND VOLTAGE SETTING METHOD

CROSS-REFERENCE TO RELATED APPLICATIONS

This application is a national phase entry of PCT Application No. PCT/JP2021/006157, filed on Feb. 18, 2021, which application is hereby incorporated herein by reference.

TECHNICAL FIELD

The present invention relates to a voltage setting circuit that controls an electronic circuit and to a semiconductor integrated circuit and a voltage setting method.

BACKGROUND

Wideband electronic circuits (such as amplifier circuits and mixer circuits, for example) are required in various fields such as optical communication, wireless communication, and radar sensing. In a case where a wideband circuit is designed with the use of bipolar transistors, it is necessary to provide a bias voltage (hereinafter referred to as "bias") so as to obtain a current with which each transistor in the core circuit operates at the highest speed (this current will be hereinafter referred to as the "optimum current"). For example, in a case where a distributed amplifier circuit 51 (Non Patent Literature 1) illustrated in FIG. 8 is used as the core circuit, the bias dependency (FIG. 9) of transmission characteristics (S21) is obtained. In an example of this circuit, the current flowing in the transistors 523 and 524 of each unit cell 52 connected to transmission line 53 changes with a bias Vb. When Vb=−1.45 V, the optimum current flows, and the band is the widest (511 in the graph). When the bias (Vb) is higher than this bias (512 in the graph) and is lower than this bias (513 in the graph), it is confirmed that the frequency characteristics deteriorate.

On the other hand, a circuit after manufacturing is affected by various kinds of fluctuations in the process, voltage, and temperature, and therefore, the optimum bias often deviates from the value that has been set at the time of the design. In view of this, it is necessary to adjust the bias and set the bias to an optimum value each time the bias is actually used. By a conventional method for detecting and setting an optimum bias, as illustrated in FIG. 10, frequency characteristics are monitored with a frequency-sweep measuring instrument 61 such as a VNA, the frequency is determined by a frequency determination circuit 63, a bias generator control circuit 64 determines the bias to be supplied, the bias output from the bias generator 65 is adjusted so that the band becomes the widest, and the optimum bias is set in a core circuit 62 of a chip 1 (Non Patent Literatures 1 and 2).

CITATION LIST

Non Patent Literature

Non Patent Literature 1: T. Jyo et al., "A 241-GHz-Bandwidth Distributed Amplifier with 10-dBm P1 dB in 0.25-μm InP DHBT Technology," 2019 IEEE/MTT-S International Microwave Symposium (IMS), Boston, MA, USA, 2019, pp. 1430-1433, doi: 10.1109/MWSYM.2019.8700975.

Non Patent Literature 2: T. Jyo et al., "A DC to 194-GHz Distributed Mixer in 250-nm InP DHBT Technology," 2020 IEEE/MTT-S International Microwave Symposium (IMS), Los Angeles, CA, USA, 2020, pp. 771-774, doi: 10.1109/IMS30576.2020.9223832.

SUMMARY

Technical Problem

However, the frequency-sweep measuring instrument required by the conventional method is generally expensive, and therefore, the costs for introducing such a frequency-sweep measuring instrument are high. Also, in a case where a large number of core circuits are used, it is necessary to set an optimum bias in all the circuits, and therefore, a long time is required before the core circuits are ready for use. Further, in a case where the use environment (temperature and the like) of the core circuit changes, the optimum bias also changes, and therefore, it is necessary to reset the optimum bias each time a change occurs in the use environment (temperature and the like) of the core circuit.

Solution to Problem

To solve the above problems, a voltage setting circuit according to embodiments of the present invention is a voltage setting circuit that supplies an optimum bias to a core circuit, and includes: a first distributed voltage-controlled oscillator; a second distributed voltage-controlled oscillator; a frequency comparator that compares the oscillation frequencies of the first distributed voltage-controlled oscillator and the second distributed voltage-controlled oscillator; a frequency determination circuit that determines the levels of the oscillation frequencies of the first distributed voltage-controlled oscillator and the second distributed voltage-controlled oscillator; a bias generator control circuit that determines the bias to be supplied to the first distributed voltage-controlled oscillator and the bias to be supplied to the second distributed voltage-controlled oscillator in accordance with a result of the determination, and determines the optimum bias to be the bias at a time when the levels of the oscillation frequencies are reversed; and a bias generator that generates the biases, supplies the biases to the first distributed voltage-controlled oscillator and the second distributed voltage-controlled oscillator, and supplies the optimum bias to the core circuit. In the voltage setting circuit, the configuration of a unit cell of the first distributed voltage-controlled oscillator and the configuration of a unit cell of the second distributed voltage-controlled oscillator are identical to the configuration of a unit cell of the core circuit.

Also, a voltage setting circuit according to embodiments of the present invention is a voltage setting circuit that supplies an optimum bias to a core circuit, and includes: a first distributed voltage-controlled oscillator; a second distributed voltage-controlled oscillator; a first current monitor that monitors the current flowing to the power supply voltage of the first distributed voltage-controlled oscillator; a second current monitor that monitors the current flowing to the power supply voltage of the second distributed voltage-controlled oscillator; a third current monitor that monitors the current flowing to the power supply voltage of the core circuit; a frequency comparator that compares the oscillation frequencies of the first distributed voltage-controlled oscillator and the second distributed voltage-controlled oscillator; a frequency determination circuit that determines the levels of the oscillation frequencies of the first distributed voltage-controlled oscillator and the second distributed voltage-controlled oscillator; a bias generator control circuit that determines the bias to be supplied to the first distributed voltage-controlled oscillator and the bias to be supplied to the second distributed voltage-controlled oscillator in accordance with a result of the determination, and controls the optimum bias to be supplied to the core circuit; and a bias generator that generates the biases and supplies the biases to the first distributed voltage-controlled oscillator and the second distributed voltage-controlled oscillator, and generates the optimum bias and supplies the optimum bias to the core circuit. In the voltage setting circuit, the optimum bias is adjusted on the basis of the current value of the first current monitor and the current value monitored by the second current monitor at a time when the levels of the oscillation frequencies are reversed. A unit cell of the first distributed voltage-controlled oscillator, a unit cell of the second distributed voltage-controlled oscillator, and a unit cell of the core circuit are identical in transistor size.

Further, a voltage setting method according to embodiments of the present invention is a voltage setting method for setting an optimum bias in a core circuit in a semiconductor integrated circuit that includes a first distributed voltage-controlled oscillator, a second distributed voltage-controlled oscillator, and the core circuit. The voltage setting method includes: a step of supplying a first bias to the first distributed voltage-controlled oscillator; a step of supplying a second bias to the second distributed voltage-controlled oscillator, the second bias having a predetermined voltage difference from the bias; a step of comparing the oscillation frequency of the first distributed voltage-controlled oscillator and the oscillation frequency of the second distributed voltage-controlled oscillator; a step of increasing or decreasing the first bias and the second bias by a predetermined voltage, when the oscillation frequency of the first distributed voltage-controlled oscillator is higher than the oscillation frequency of the second distributed voltage-controlled oscillator; a step of supplying the increased or decreased first bias and the increased or decreased second bias to the first distributed voltage-controlled oscillator and the second distributed voltage-controlled oscillator, respectively; a step of comparing the oscillation frequency of the first distributed voltage-controlled oscillator and the oscillation frequency of the second distributed voltage-controlled oscillator at the increased or decreased first bias and the increased or decreased second bias, respectively; and a step of determining the optimum bias to be the bias supplied to the second distributed voltage-controlled oscillator when the levels of the oscillation frequency of the first distributed voltage-controlled oscillator and the oscillation frequency of the second distributed voltage-controlled oscillator at the increased or decreased first bias and the increased or decreased second bias are reversed.

Also, a voltage setting method according to embodiments of the present invention is a voltage setting method for setting an optimum bias in a core circuit in a semiconductor integrated circuit that includes a first distributed voltage-controlled oscillator, a second distributed voltage-controlled oscillator, and the core circuit. The voltage setting method includes: a step of supplying a first bias to the first distributed voltage-controlled oscillator; a step of supplying a second bias to the second distributed voltage-controlled oscillator, the second bias having a predetermined voltage difference from the bias; a step of comparing the oscillation frequency of the first distributed voltage-controlled oscillator and the oscillation frequency of the second distributed voltage-controlled oscillator; a step of increasing or decreasing the first bias and the second bias by a predetermined voltage, when the oscillation frequency of the first distributed voltage-controlled oscillator is higher than the oscillation frequency of the second distributed voltage-controlled oscillator; a step of supplying the increased or decreased first bias and the increased or decreased second bias to the first distributed voltage-controlled oscillator and the second distributed voltage-controlled oscillator, respectively; a step of comparing the oscillation frequency of the first distributed voltage-controlled oscillator and the oscillation frequency of the second distributed voltage-controlled oscillator at the increased or decreased first bias and the increased or decreased second bias, respectively; a step of monitoring the current flowing in the first distributed voltage-controlled oscillator and the current flowing in the second distributed voltage-controlled oscillator, when the levels of the oscillation frequency of the first distributed voltage-controlled oscillator and the oscillation frequency of the second distributed voltage-controlled oscillator at the increased or decreased first bias and the increased or decreased second bias are reversed; and a step of determining the optimum bias to be supplied to the core circuit, to cause the current value determined on the basis of the monitored current value to flow into the core circuit.

Advantageous Effects of Embodiments of the Invention

According to embodiments of the present invention, it is possible to provide a voltage setting circuit, a semiconductor integrated circuit, and a voltage setting method that are capable of easily controlling operations of the core circuit in a wide band.

DETAILED DESCRIPTION OF ILLUSTRATIVE EMBODIMENTS

First Embodiment

A voltage setting circuit and a semiconductor integrated circuit according to a first embodiment of the present invention are described below with reference to FIGS. 1 to 5.

Figure 1:
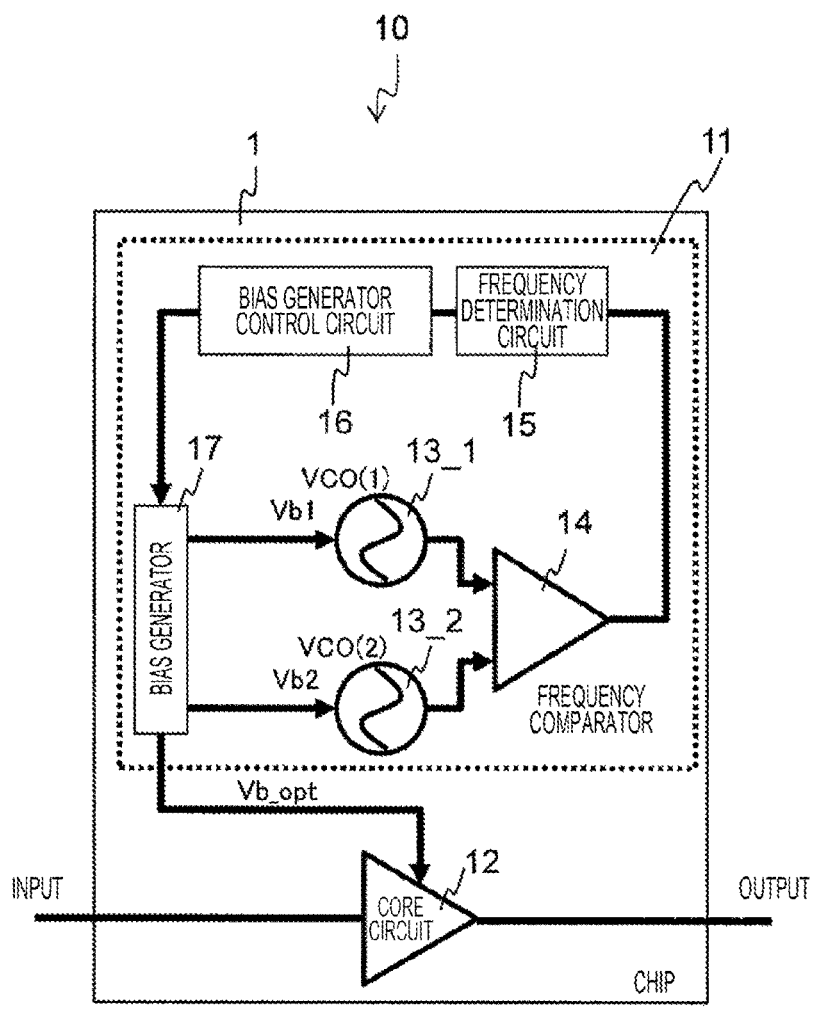
FIG. 1 is a block diagram illustrating the configuration of a semiconductor integrated circuit according to a first embodiment of the present invention.

Configurations of a Semiconductor Integrated Circuit and a Voltage Setting Circuit As illustrated in FIG. 1, the semiconductor integrated circuit 10 according to this embodiment includes, on the same chip 1, a voltage setting circuit 11 and a core circuit 12 to which the voltage setting circuit 11 is connected.

The voltage setting circuit 11 includes two distributed voltage-controlled oscillators (hereinafter referred to as "VCOs") 13_1 and 13_2, a frequency comparator 14, a frequency determination circuit 15, a bias generator control circuit 16, and a bias generator 17.

Figure 2A:
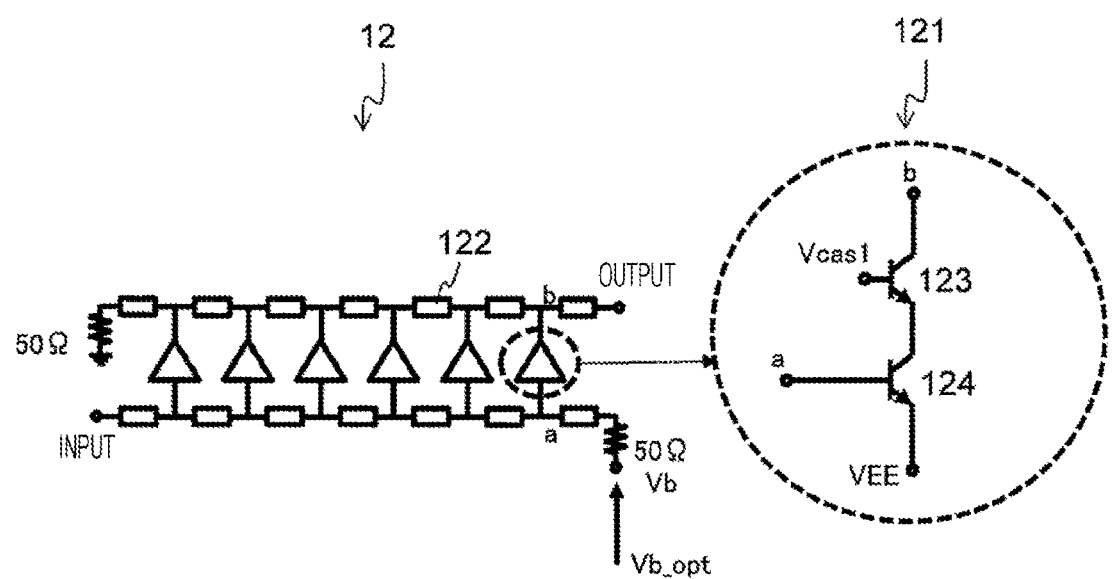
FIG. 2A is a block diagram illustrating the configuration of the core circuit in the semiconductor integrated circuit according to the first embodiment of the present invention.

As illustrated in FIG. 2A, a distributed amplifier circuit is used as the core circuit 12. In the distributed amplifier circuit, unit cells formed with transistor circuits are connected in parallel via a transmission line and are terminated at 50Ω. A voltage Vb is applied to the one terminal to be terminated. In the semiconductor integrated circuit 10, a voltage Vb_opt optimized by the voltage setting circuit 11 is applied.

In a unit cell of the core circuit 12, two transistors 123 and 124 are connected in series, and are connected to a transmission line 122. In one transistor (first transistor) 123 of the two transistors, the collector is connected to the transmission line 122 at a contact b on the output side, and Vcas1 is input to the base. In the other transistor (second transistor) 124, a contact a on the side at which Vb is applied to the base is connected to the transmission line 122, and a voltage VEE is supplied to the emitter.

In the core circuit 12, the transmission line 122 as an equivalent circuit has L, C, and R.

Figure 2B:
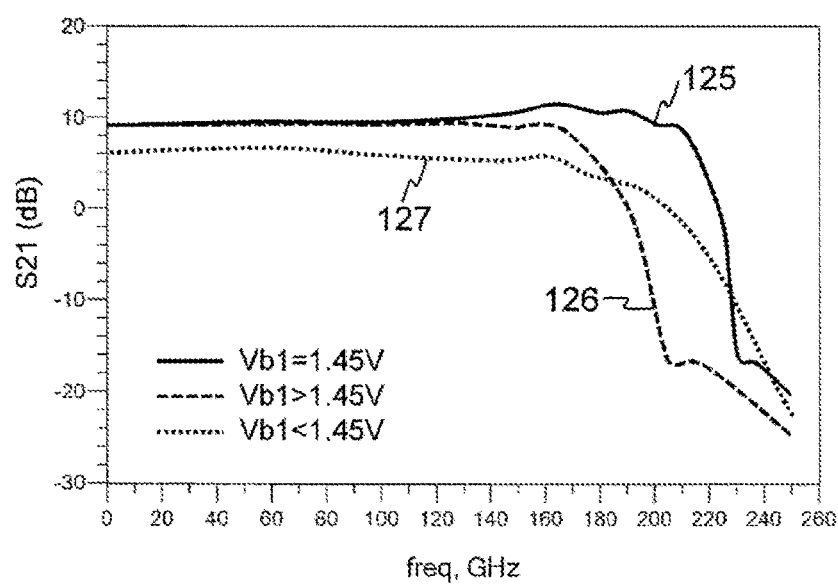
FIG. 2B is a graph illustrating the device characteristics of the core circuit in the semiconductor integrated circuit according to the first embodiment of the present invention.

FIG. 2B illustrates the bias dependency of the transmission characteristics (S21) in the core circuit (distributed amplifier circuit) 12. In the core circuit (distributed amplifier circuit) 12, the current flowing in the transistors of each unit cell changes due to the bias Vb, and the frequency characteristics change. When Vb=−1.45 V, the optimum current flows, and the band is the widest (125 in the graph). Hereinafter, the bias (Vb) when the optimum current flows will be referred to as the "optimum bias". When the bias (Vb) is higher than the optimum bias (126 in the graph) and is lower than the optimum bias (127 in the graph), the band is narrower, and the frequency characteristics deteriorate.

Figure 3A:
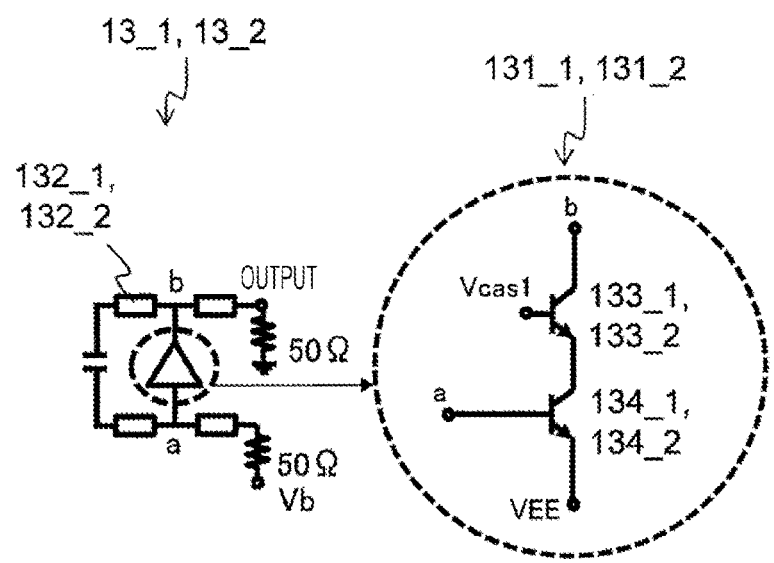
FIG. 3A is a block diagram illustrating the configuration of a distributed voltage-controlled oscillator in a voltage setting circuit according to the first embodiment of the present invention.

The distributed VCOs (1) 13_1 and (2) 13_2 have the configuration illustrated in FIG. 3A, in which a unit cell and a capacitor are connected in parallel via a transmission line. The unit cells of the distributed VCOs (1) 13_1 and (2) 13_2 have the same configuration as the unit cells of the core circuit 12.

As for the unit cells of the distributed VCOs (1) 13_1 and (2) 13_2, two transistors are connected in series in each unit cell, and are connected to a transmission line. In one transistor (first transistor) 133_1 (133_2) of the two transistors, the collector is connected to the transmission line 132_1 (132_2) at a contact b on the output side, and Vcas1 is input to the base. In the other transistor (second transistor) 134_1 (134_2), a contact a on the side at which Vb is applied to the base is connected to the transmission line 132_1 (132_2), and a voltage VEE is supplied to the emitter.

Figure 3B:
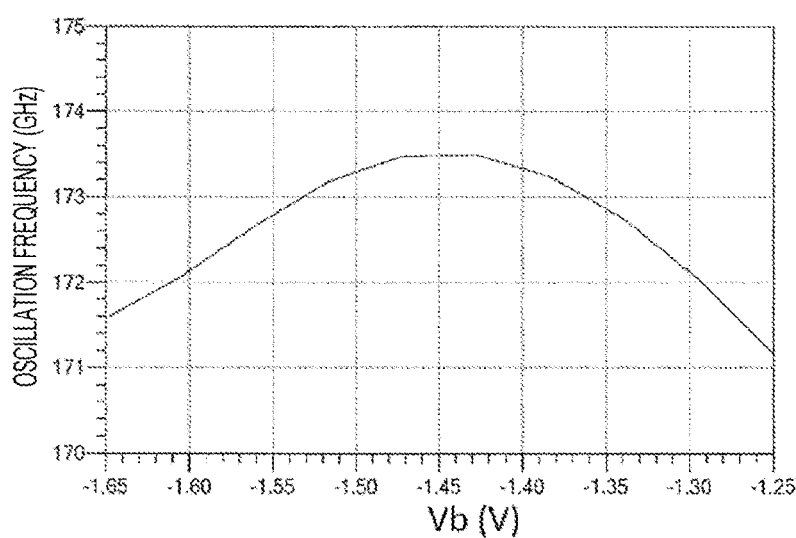
FIG. 3B is a graph illustrating the device characteristics of a distributed voltage-controlled oscillator in the voltage setting circuit according to the first embodiment of the present invention.

FIG. 3B illustrates the bias dependency of the oscillation frequencies of the distributed VCOs used as the VCO (1) 13_1 and the VCO (2) 13_2. When Vb=−1.45 V, the optimum current flows in the transistors, and the oscillation frequencies become the highest.

Biases Vb1 and Vb2 are input to the distributed VCOs (1) 13_1 and (2) 13_2, and a voltage difference is present between the biases Vb1 and Vb2.

The frequency comparator 14 is formed with a Gilbert cell circuit, for example. A signal indicating a frequency level is output. For example, when the frequency of the VCO (1) 13_1 is high, a high-voltage signal H is output. When the frequency of the VCO (2) 13_2 is high, a low-voltage signal L is output.

The frequency determination circuit 15 is formed with a digital processing circuit, and determines whether the output of the frequency comparator 14 is at the H level or the L level. As a result, the levels of the frequencies of the two signals input to the frequency comparator 14 are determined.

The bias generator control circuit 16 determines the bias values to be generated by the bias generator 17 on the basis of the determination result from the frequency determination circuit 15, and controls the bias generator 17.

The bias generator 17 generates biases, and inputs the respective biases to the distributed VCOs (1) 13_1 and (2) 13_2. Also, the optimum bias is generated, and is supplied to the core circuit 12.

Operation to be Performed by the Voltage Setting Circuit

An operation to be performed by the voltage setting circuit 11 according to this embodiment is described below.

In embodiments of the present invention, the feature that the oscillation frequencies of the distributed VCOs (1) 13_1 and (2) 13_2 become the highest when the optimum current is flowing in the transistors to be used in the distributed VCOs (1) 13_1 and (2) 13_2 is taken advantage of in detecting the optimum bias.

According to the bias dependency of the oscillation frequencies of the VCO (1) 13_1 and the VCO (2) 13_2 illustrated in FIG. 3B, the optimum current flows in the transistors when Vb=−1.45 V, and the oscillation frequencies become the highest at that time. As illustrated in FIG. 2B, this bias (Vb=−1.45 V) coincides with the bias at which the core circuit (distributed amplifier circuit) 12 exhibits the widest frequency characteristics.

Therefore, the optimum bias that maximizes the oscillation frequencies of the distributed VCOs (1) 13_1 and (2) 13_2 having the same unit cells as those of the core circuit 12 is detected, and this optimum bias is set as the bias of the core circuit 12, so that the core circuit 12 can be operated in the widest band.

To detect the optimum bias in the voltage setting circuit 11, two distributed VCOs (the VCO (1) 13_1 and the VCO (2) 13_2) having the same configurations are used in an embodiment of the present invention. However, a predetermined voltage difference is present between the biases to be supplied to the two distributed VCOs (1) 13_1 and (2) 13_2. For example, when the bias Vb1 is set for the distributed VCO (1) 13_1, and the bias Vb2 is set for the distributed VCO (2) 13_2, a bias that is higher by 10 mV is set as Vb1.

Figure 4:
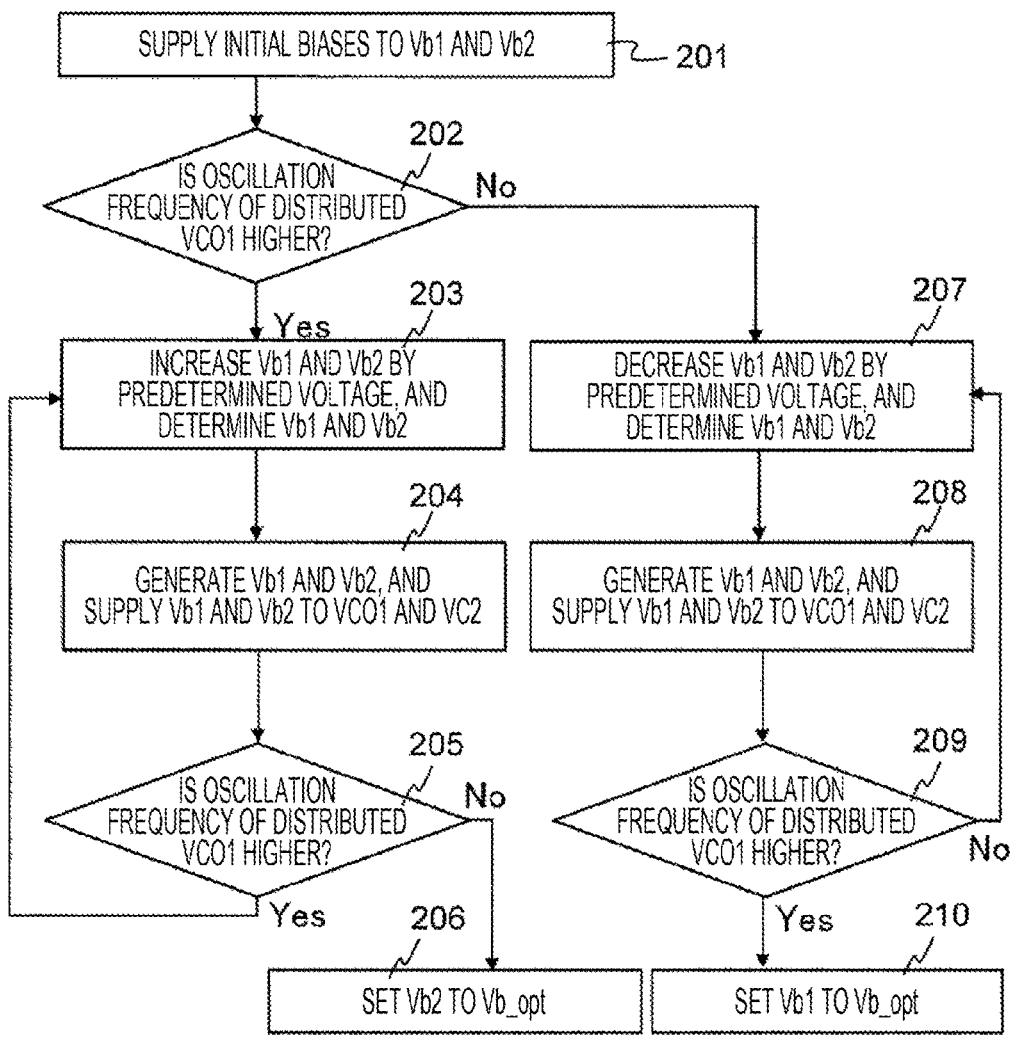
FIG. 4 is a flowchart for explaining an operation of the voltage setting circuit according to the first embodiment of the present invention.

An example operation process to be performed by the voltage setting circuit 11 is now described with reference to a flowchart shown in FIG. 4.

First, the biases Vb1 and Vb2 (initial biases) are supplied to the two distributed VCOs, which are the VCO (1) 13_1 and the VCO (2) 13_2, respectively (step 201).

Next, the frequency comparator 14 and the frequency determination circuit 15 compare the oscillation frequencies of the VCO (1) 13_1 and the VCO (2) 13_2, and determine whether the oscillation frequency of the VCO (1) 13_1 is higher (step 202).

Next, if the frequency of the VCO (1) 13_1 is higher, the bias generator control circuit 16 determines voltage values obtained by adding a predetermined voltage (10 mV, for example) to both Vb1 and Vb2, and controls the bias generator 17 (step 203).

Next, Vb1 and Vb2 are supplied to the VCO (1) 13_1 and the VCO (2) 13_2 by the bias generator 17 (step 204).

Next, the frequency comparator 14 and the frequency determination circuit 15 again compare the oscillation frequencies of the VCO (1) 13_1 and the VCO (2) 13_2, and determine whether the oscillation frequency of the VCO (1) 13_1 is higher (step 205).

As a result, if the frequency of the VCO (1) 13_1 is higher, the process returns to step 203, and the voltage values obtained by adding a predetermined voltage to both Vb1 and Vb2 are again determined, and the same steps are repeated.

If the frequency of the VCO (1) 13_1 is not higher, which is a case where the frequency of the VCO (1) 13_1 is lower or the oscillation frequencies of the VCO (1) 13_1 and the VCO (2) 13_2 are equal to each other, on the other hand, Vb2 is determined to be the optimum bias Vb_opt. In this manner, the bias at the time when the levels of the oscillation frequencies of the VCO (1) 13_1 and the VCO (2) 13_2 are reversed is determined to be the optimum bias Vb_opt (step 206).

If the frequency of the VCO (1) 13_1 is not higher (if the frequency of the VCO (1) 13_1 is lower, or the oscillation frequencies of the VCO (1) 13_1 and the VCO (2) 13_2 are equal to each other) in step 202, on the other hand, the bias generator control circuit 16 determines the voltage values obtained by decreasing both Vb1 and Vb2 by a predetermined voltage (10 mV, for example), and controls the bias generator 17 (step 207).

Next, Vb1 and Vb2 are supplied to the VCO (1) 13_1 and the VCO (2) 13_2 by the bias generator 17 (step 208).

Next, the frequency comparator 14 and the frequency determination circuit 15 again compare the oscillation frequencies of the VCO (1) 13_1 and the VCO (2) 13_2, and determine whether the oscillation frequency of the VCO (1) 13_1 is higher (step 209).

As a result, if the frequency of the VCO (1) 13_1 is not higher (if the frequency of the VCO (1) 13_1 is lower, or the oscillation frequencies of the VCO (1) 13_1 and the VCO (2) 13_2 are equal to each other), the process returns to step 207, in which the voltage values obtained by decreasing both Vb1 and Vb2 by the predetermined voltage are again determined, and the same steps are then repeated.

If the frequency of the VCO (1) 13_1 is higher, on the other hand, Vb1 is determined as the optimum bias Vb_opt. In this manner, the bias at the time when the levels of the oscillation frequencies of the VCO (1) 13_1 and the VCO (2) 13_2 are reversed is determined to be the optimum bias Vb_opt (step 210).

Lastly, the optimum bias Vb_opt determined as described above is supplied to the core circuit 12.

In this embodiment, an example in which a higher bias than that of the VCO (2) 13_2 is supplied to the VCO (1) 13_1 has been described, but a higher bias than that of the VCO (1) 13_1 may be supplied to the VCO (2) 13_2. Also, in step 202, the oscillation frequency of the VCO (2) 13_2 may be used in the determination.

As described above, in the voltage setting circuit 11 according to this embodiment, voltages with a predetermined voltage difference are supplied to the two distributed VCOs (1) 13_1 and (2) 13_2, the levels of the output frequencies are determined, Vb1 and Vb2 are increased or decreased stepwise in accordance with the determination result, and the bias at which the maximum oscillation frequency is obtained is detected. This bias is determined to be the optimum bias Vb_opt, and is supplied to the core circuit 12.

As described above, the optimum voltage (bias) of the oscillators is acquired on the basis of the output (frequency) difference between the two oscillators that oscillate when different voltages are applied thereto, and the core circuit 12 formed with the same unit cells as those of the oscillators can be controlled with the optimum voltage.

With the voltage setting circuit according to this embodiment, detection and setting of the optimum bias can be performed in a closed manner in the chip. Accordingly, it is not necessary to use a frequency-sweep measuring instrument, detection and setting of the optimum bias can be easily performed, the core circuit can be operated in a wide band, and the costs can be lowered.

Furthermore, the optimum bias is automatically detected and set. Accordingly, in a case where a large number of circuits are used, or the use environment changes, it is not necessary to measure the frequency characteristics every time a circuit is operated, and the time required to start the use of the circuit can be greatly shortened.

As described above, the voltage setting circuit according to this embodiment determines and controls the optimum bias of the core circuit by determining the optimum bias of the distributed voltage-controlled oscillators (VCOs) having the same unit cells as those of the core circuit.

In the voltage setting circuit and the semiconductor integrated circuit according to this embodiment, the distributed VCOs are preferably disposed at positions close to the core circuit. Since the device characteristics are non-uniform in the chip plane, it is possible to reduce the influence of the non-uniform characteristics distribution by shortening the distance between devices. As a result, the accuracy in setting the optimum bias can be improved.

Figure 5:
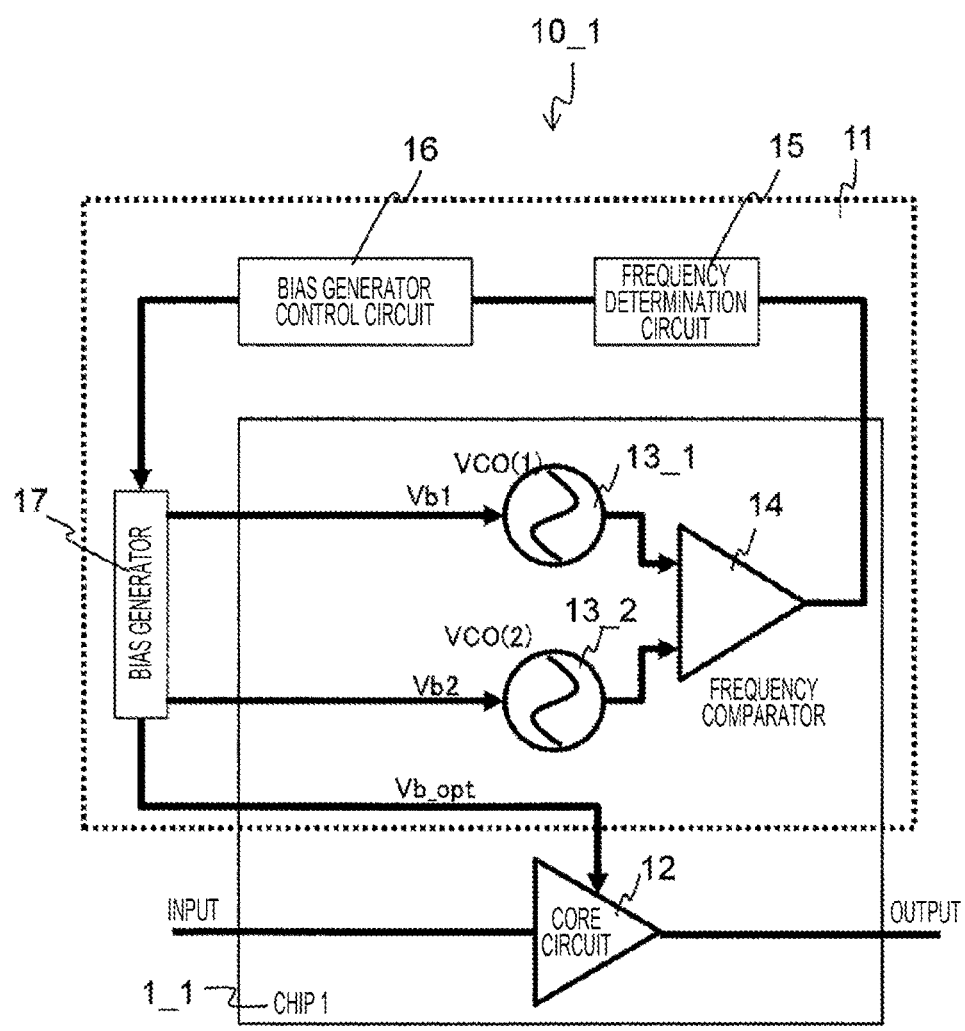
FIG. 5 is a block diagram illustrating an example configuration of the semiconductor integrated circuit according to the first embodiment of the present invention.

In the above-described example of the semiconductor integrated circuit 10 according to this embodiment, the two distributed VCOs (1) 13_1 and (2) 13_2, the frequency comparator 14, the frequency determination circuit 15, the bias generator control circuit 16, and the bias generator 17 are provided on the same chip 1. However, this embodiment is not limited to this example. As illustrated in FIG. 5, in a semiconductor integrated circuit 10_1, the frequency determination circuit 15, the bias generator control circuit 16, and the bias generator 17 may not be disposed on the same chip 1_1. Even in this arrangement, an output signal of the frequency comparator 14 and each bias are direct-current (DC) signals. Thus, the accuracy in detecting and setting the optimum bias is not affected, and the same effects are achieved.

Second Embodiment

A voltage setting circuit and a semiconductor integrated circuit according to a second embodiment of the present invention are now described with reference to FIG. 6.

Figure 6:
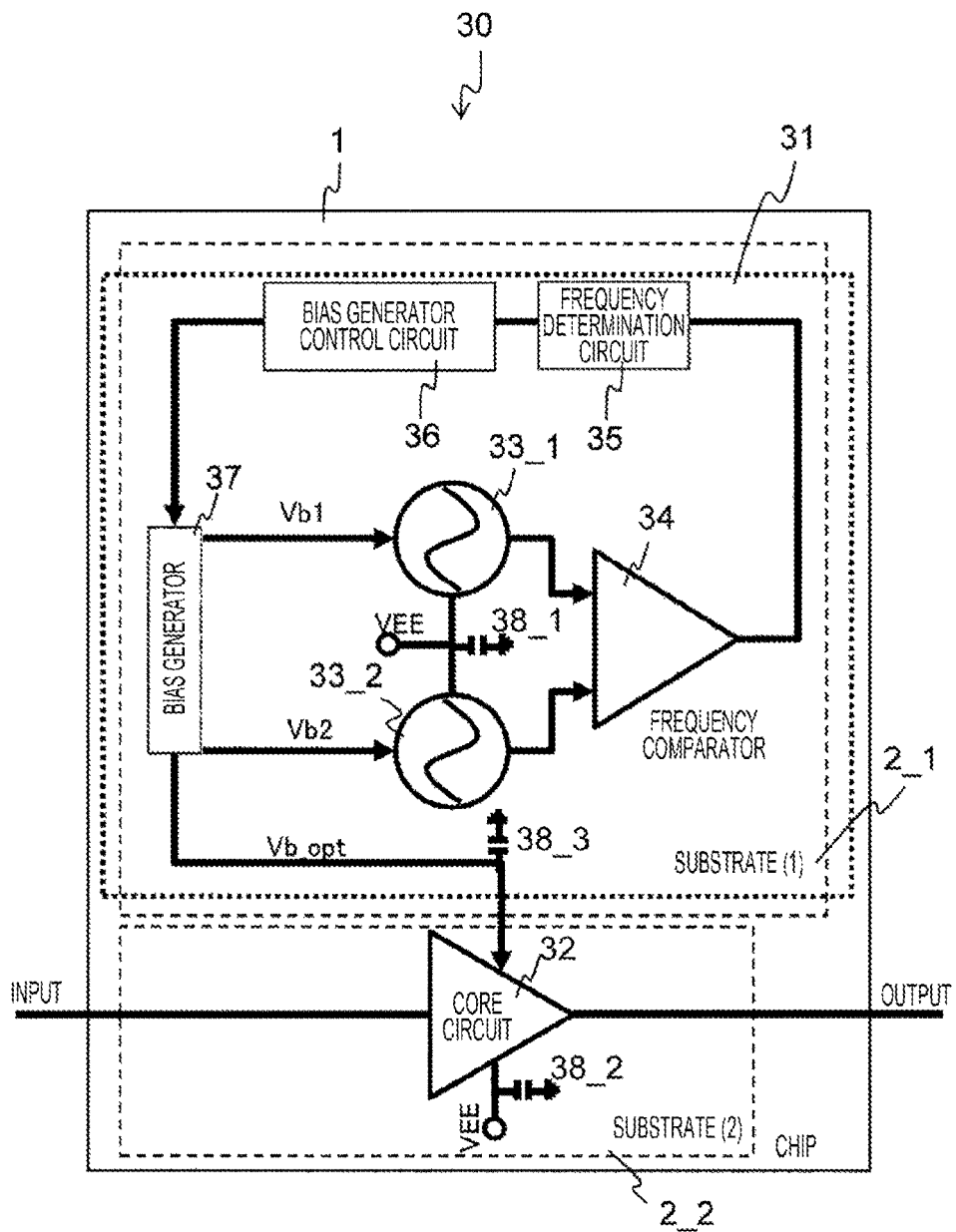
FIG. 6 is a block diagram illustrating the configuration of a semiconductor integrated circuit according to a second embodiment of the present invention.

As illustrated in FIG. 6, a semiconductor integrated circuit 30 according to this embodiment includes a voltage setting circuit 31, and a core circuit 32 to which the voltage setting circuit 31 is connected, on different substrates, which are a substrate (1) 2_1 and a substrate (2) 2_2 on the same chip 1. The other components and the effects are the same as those of the first embodiment.

Here, decoupling capacitors 38_1 and 38_2 are connected to a terminal for a power supply voltage (VEE) between a VCO (1) 33_1 and a VCO (2) 33_2, and a terminal for a power supply voltage (VEE) of the core circuit 32, respectively. With the decoupling capacitors 38_1 and 38_2, it becomes possible to prevent oscillator noise from being coupled to the core circuit 32.

Here, the decoupling capacitors 38_1 and 38_2 are preferably disposed near the respective power supply voltages (VEE). The shorter the distances between the decoupling capacitors 38_1 and 38_2 and the power supply voltages (VEE), the more the noise can be reduced.

Further, as a decoupling capacitor 38_3 is connected to the wiring line of Vb_opt to be supplied to the core circuit 32, it is possible to prevent oscillator noise from being coupled to the core circuit 32. Here, the decoupling capacitor 38_3 is preferably disposed near the core circuit 32. The shorter the distance between the decoupling capacitor 38_3 and the core circuit 32, the more the noise can be reduced.

The voltage setting circuit 31 operates in the same manner as in the operation process (FIG. 4) in the first embodiment.

With the voltage setting circuit according to this embodiment, the optimum bias can be easily detected and set, the core circuit can be operated in a wide band, the costs and times can be reduced, and the influence of oscillator noise can be reduced.

Third Embodiment

A voltage setting circuit and a semiconductor integrated circuit according to a third embodiment of the present invention are now described with reference to FIG. 7. In the first and second embodiments, unit cells having the same configuration as those in the core circuit are used for the distributed VCOs. A voltage setting circuit 41 according to this embodiment can cope with a case where it is difficult to use unit cells having the same configuration as those in a core circuit 42 for distributed VCOs (1) 43_1 and (2) 43_2.

Figure 7:
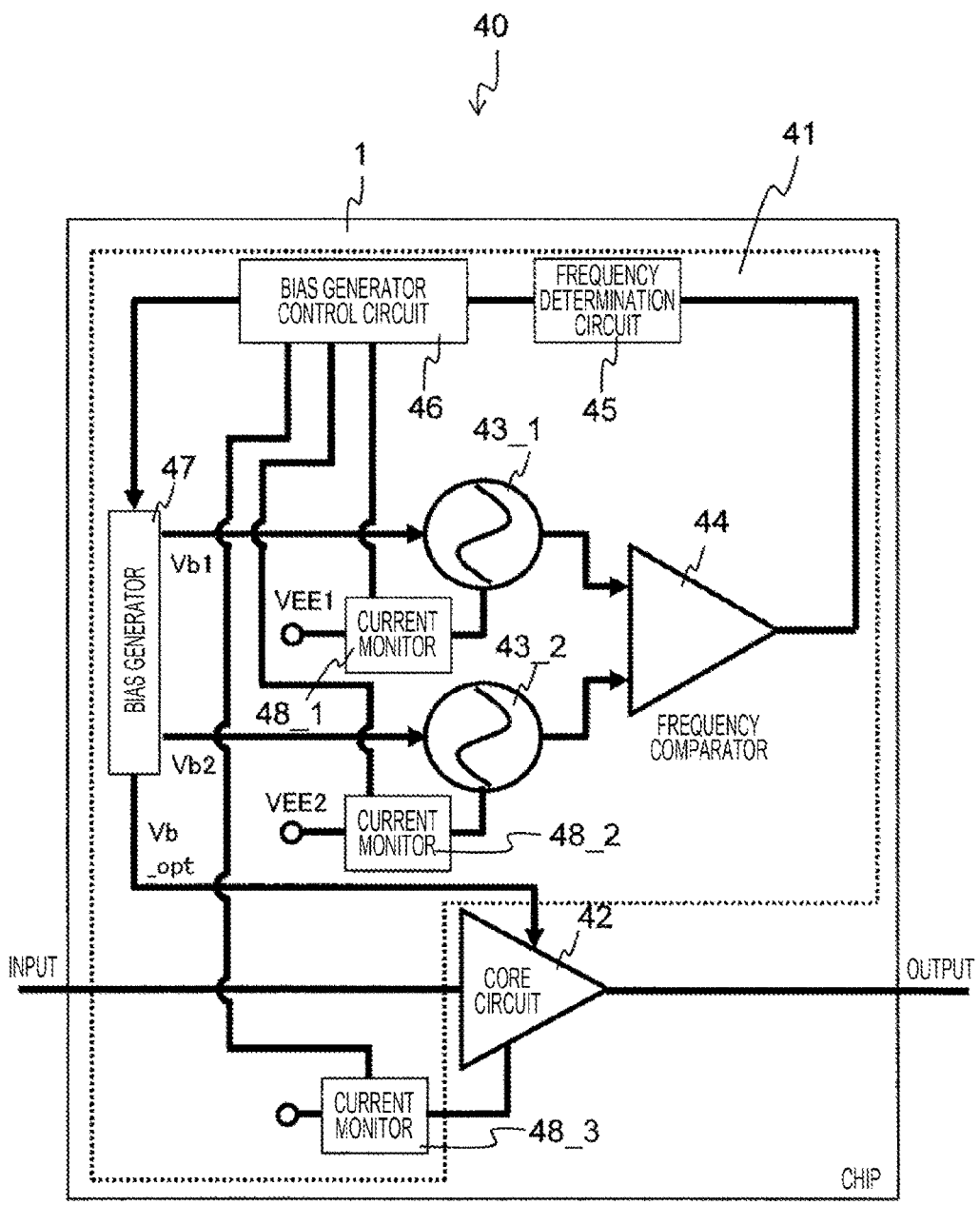
FIG. 7 is a block diagram illustrating the configuration of a semiconductor integrated circuit according to a third embodiment of the present invention.
Figure 8:
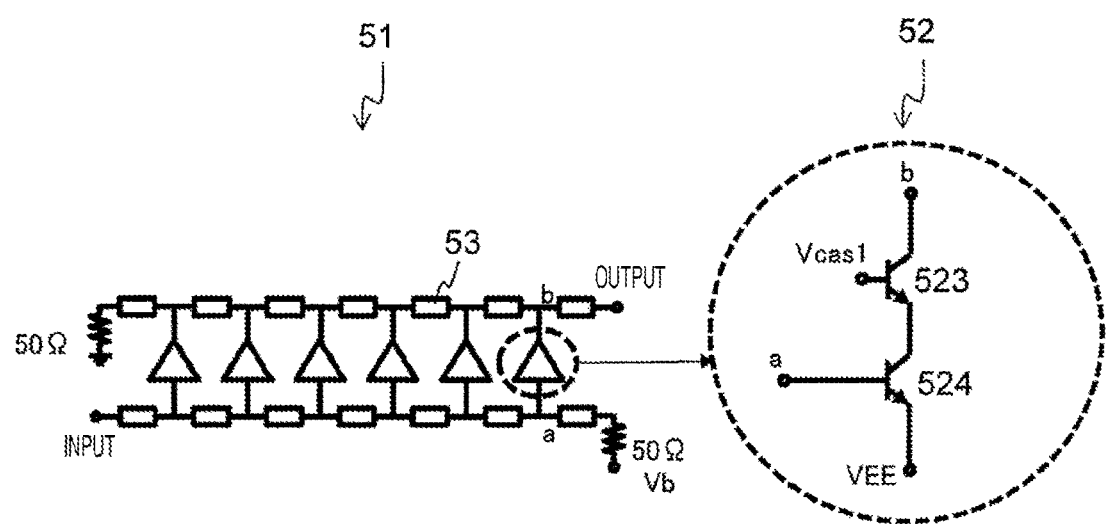
FIG. 8 is a block diagram illustrating a configuration of a conventional distributed amplifier circuit.
Figure 9:
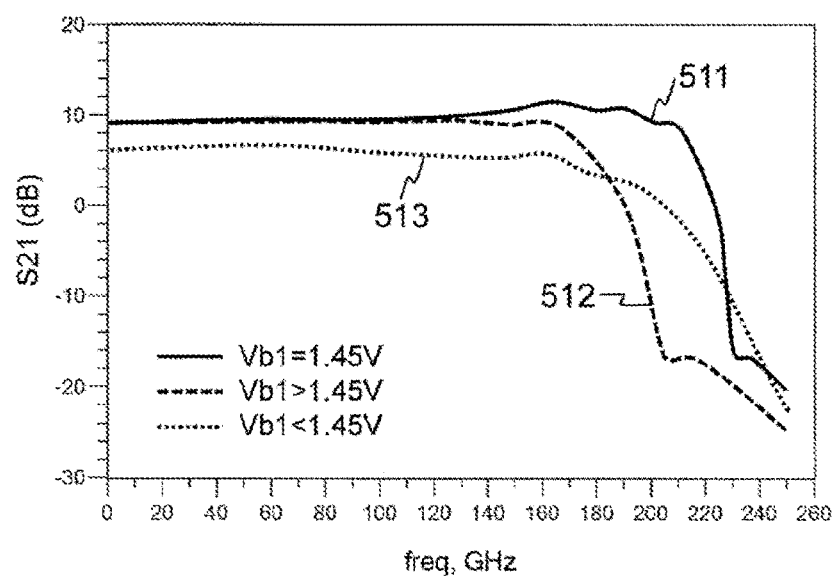
FIG. 9 is a diagram illustrating device characteristics of the conventional distributed amplifier circuit.
Figure 10:
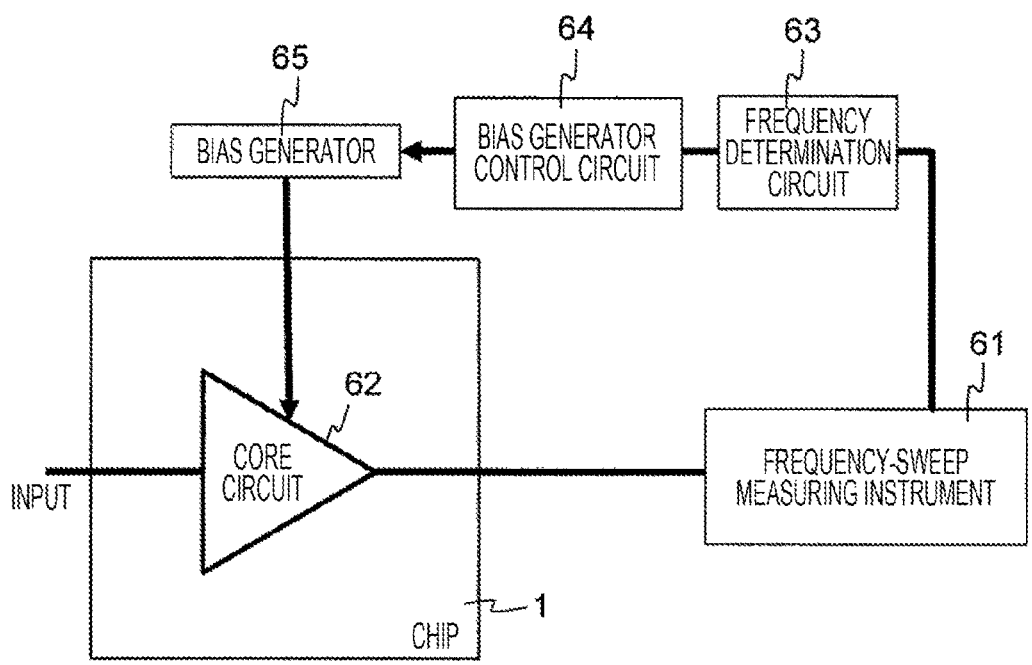
FIG. 10 is a diagram for explaining a conventional voltage setting method.

Configurations of a Semiconductor Integrated Circuit and a Voltage Setting Circuit As illustrated in FIG. 7, a semiconductor integrated circuit 40 according to this embodiment includes, on the same chip 1, the voltage setting circuit 41 and the core circuit 42 to which the voltage setting circuit 41 is connected. The voltage setting circuit 41 includes two distributed VCOs (1) 43_1 and (2) 43_2, a frequency comparator 44, a frequency determination circuit 45, a bias generator control circuit 46, and a bias generator 47, as in the first embodiment.

The semiconductor integrated circuit 40 further includes current monitors 48_1, 48_2, and 48_3 having circuits that monitor currents flowing in the respective power supply voltages of the VCO (1) 43_1, the VCO (2) 43_2, and the core circuit 42.

Further, the size (emitter length) of the transistors in the VCO (1) 43_1 and the VCO (2) 43_2 is the same as the size (emitter length) of the transistors in the core circuit 42.

Operation to be Performed by the Voltage Setting Circuit

An operation to be performed by the voltage setting circuit 41 according to this embodiment is described below.

First, as in the first embodiment, the biases Vb1 and Vb2 are increased or decreased stepwise, the oscillation frequencies of the VCO (1) 43_1 and the VCO (2) 43_2 are compared, and the bias at the time when the levels of the oscillation frequencies of the VCOs are reversed is determined to be the optimum bias. In this manner, the bias at which the oscillation frequency becomes maximum is detected as the optimum bias.

Next, the currents (optimum currents) at the optimum bias in the VCO (1) 43_1 and the VCO (2) 43_2 are monitored by the current monitors 48_1 and 48_2.

Next, the optimum current in the core circuit 42 is determined on the basis of the optimum currents in the VCO (1) 43_1 and the VCO (2) 43_2. As the optimum current in the core circuit 42, one of the optimum currents in the VCO (1) 43_1 and the VCO (2) 43_2 may be used, or the average current value of both may be used, for example. Further, in a case where one unit cell is used in the VCO (1) 43_1 or the VCO (2) 43_2, and N unit cells are used in the core circuit 42, the optimum current of the core circuit is equal to (N×the optimum current of the VCO (1) 43_1 or the VCO (2) 43_2). For example, in a case where one unit cell is used in the VCO (1) 43_1 or the VCO (2) 43_2, and six unit cells are used in the core circuit 42, the optimum current of the core circuit is equal to (6×the optimum current of the VCO (1) 43_1 or the VCO (2) 43_2).

Next, the current flowing in the core circuit 42 is monitored by the current monitor 48_3 of the core circuit 42, and the bias is adjusted so that the optimum current of the core circuit 42 described above flows in the core circuit 42 (the bias at which the optimum current is obtained is the optimum bias Vb_opt).

With the voltage setting circuit according to this embodiment, the optimum current of the core circuit can be easily set without the use of unit cells having the same configuration as those of the core circuit in the distributed VCOs, and the core circuit can be operated in a wide band.

In the semiconductor integrated circuit according to this embodiment, the distributed VCOs are preferably disposed at positions close to the core circuit, as in the first embodiment.

Also, in the semiconductor integrated circuit according to this embodiment, the frequency determination circuit, the bias generator control circuit, and the bias generator may not be disposed on the same chip, as in the first embodiment.

Also, the semiconductor integration according to this embodiment may include the voltage setting circuit, and the core circuit to which the voltage setting circuit is connected, on different substrates, which are a substrate (1) and a substrate (2) on the same chip, as in the second embodiment.

Further, in the first to third embodiments described above, after the optimum bias is set in the core circuit, the power supplies to the two distributed VCOs, the frequency comparator, and the frequency determination circuit are turned off, so that the power consumption can be reduced, and the noise in the core circuit can be reduced.

In the embodiments of the present invention, a configuration in which two transistors are connected in series to a unit cell common to the unit cells of the distributed VCOs of the voltage setting circuit and the core circuit is used. However, the present invention is not limited to this. A unit cell may have a configuration using one transistor or a configuration using a plurality of transistors, as long as unit cells can constitute an oscillation circuit and have the same configuration between the distributed VCOs of the voltage setting circuit and the core circuit.

In the examples described in the embodiments of the present invention, an amplifier circuit is used for the core circuit. However, the present invention is not limited to this, and a mixer may be used instead.

In the embodiments of the present invention, examples of structures, dimensions, materials, and the like of the respective components have been described above in relation to the configurations of a voltage setting circuit and a semiconductor integrated circuit, a voltage setting method, and the like. However, the present invention is not limited to these examples. A voltage setting circuit, a semiconductor integrated circuit, and a voltage setting method are only required to achieve their effects.

INDUSTRIAL APPLICABILITY

Embodiments of the present invention can be applied to instruments and electronic circuits of devices that are used for optical communication, wireless communication, radar sensing, and the like.

REFERENCE SIGNS LIST 11 voltage setting circuit
12 core circuit
13_1, 13_2 distributed voltage-controlled oscillator
14 frequency comparator
15 frequency determination circuit
16 bias generator control circuit
17 bias generator
121, 131_1, 131_2 unit cell

The invention claimed is:

1. A voltage setting circuit that supplies an optimum bias to a core circuit, the voltage setting circuit comprising:
a first distributed voltage-controlled oscillator;
a second distributed voltage-controlled oscillator;
a frequency comparator configured to compare oscillation frequencies of the first distributed voltage-controlled oscillator and the second distributed voltage-controlled oscillator;
a frequency determination circuit configured to determine levels of the oscillation frequencies of the first distributed voltage-controlled oscillator and the second distributed voltage-controlled oscillator;
a bias generator control circuit configured to determine a first bias to be supplied to the first distributed voltage-controlled oscillator and a second bias to be supplied to the second distributed voltage-controlled oscillator in accordance with a result of the determination and to determine the optimum bias to be the first bias or the second bias at a time when the levels of the oscillation frequencies are reversed; and
a bias generator configured to generate the first bias, the second bias, and the optimum bias, supply the first bias to the first distributed voltage-controlled oscillator and the second bias to the second distributed voltage-controlled oscillator, and supply the optimum bias to the core circuit, wherein
a configuration of a unit cell of the first distributed voltage-controlled oscillator and a configuration of a unit cell of the second distributed voltage-controlled oscillator are identical to a configuration of a unit cell of the core circuit.

2. A semiconductor integrated circuit comprising:
the voltage setting circuit according to claim 1; and
the core circuit connected to the voltage setting circuit.

3. The semiconductor integrated circuit according to claim 2, wherein the voltage setting circuit and the core circuit are disposed on a same chip.

4. The semiconductor integrated circuit according to claim 2, wherein:
the voltage setting circuit is disposed on a first substrate;
the core circuit is disposed on a second substrate; and
a decoupling capacitor is connected to each of power supply voltage terminals of the first distributed voltage-controlled oscillator and the second distributed voltage-controlled oscillator, a power supply voltage terminal of the core circuit, and a wiring line through which the optimum bias is supplied from the bias generator to the core circuit.

5. A voltage setting method for setting the optimum bias in the core circuit in the semiconductor integrated circuit according to claim 2, the voltage setting method comprising:
supplying the first bias to the first distributed voltage-controlled oscillator;
supplying the second bias to the second distributed voltage-controlled oscillator, the second bias having a predetermined voltage difference from the first bias;
comparing the oscillation frequency of the first distributed voltage-controlled oscillator and the oscillation frequency of the second distributed voltage-controlled oscillator;
in response to a determination that the oscillation frequency of the first distributed voltage-controlled oscillator is higher than the oscillation frequency of the second distributed voltage-controlled oscillator, increasing or decreasing the first bias and the second bias by a predetermined voltage;
supplying the increased or decreased first bias and the increased or decreased second bias to the first distributed voltage-controlled oscillator and the second distributed voltage-controlled oscillator, respectively;
comparing the oscillation frequency of the first distributed voltage-controlled oscillator and the oscillation frequency of the second distributed voltage-controlled oscillator at the increased or decreased first bias and the increased or decreased second bias, respectively; and
in response to a determination that levels of the oscillation frequency of the first distributed voltage-controlled oscillator and the oscillation frequency of the second distributed voltage-controlled oscillator at the increased or decreased first bias and the increased or decreased second bias are reversed, determining the optimum bias to be the second bias supplied to the second distributed voltage-controlled oscillator.

6. The voltage setting method according to claim 5, further comprising:
setting the optimum bias in the core circuit; and
after setting the optimum bias in the core circuit, turning off power supplies to the first distributed voltage-controlled oscillator, the second distributed voltage-controlled oscillator, the frequency comparator, and the frequency determination circuit.

7. The voltage setting method according to claim 5, wherein the voltage setting circuit and the core circuit are disposed on a same chip.

8. The voltage setting method according to claim 5, wherein:
the voltage setting circuit is disposed on a first substrate;
the core circuit is disposed on a second substrate; and
a decoupling capacitor is connected to each of power supply voltage terminals of the first distributed voltage-controlled oscillator and the second distributed voltage-controlled oscillator, a power supply voltage terminal of the core circuit, and a wiring line through which the optimum bias is supplied from the bias generator to the core circuit.

9. A voltage setting circuit that supplies an optimum bias to a core circuit, the voltage setting circuit comprising:
a first distributed voltage-controlled oscillator;
a second distributed voltage-controlled oscillator;
a first current monitor configured to monitor a current flowing to a power supply voltage of the first distributed voltage-controlled oscillator;
a second current monitor configured to monitor a current flowing to a power supply voltage of the second distributed voltage-controlled oscillator;
a third current monitor configured to monitor a current flowing to a power supply voltage of the core circuit;
a frequency comparator configured to compare oscillation frequencies of the first distributed voltage-controlled oscillator and the second distributed voltage-controlled oscillator;
a frequency determination circuit configured to determine levels of the oscillation frequencies of the first distributed voltage-controlled oscillator and the second distributed voltage-controlled oscillator;
a bias generator control circuit configured to determine a first bias to be supplied to the first distributed voltage-controlled oscillator and a second bias to be supplied to the second distributed voltage-controlled oscillator in accordance with a result of the determination and control the optimum bias to be supplied to the core circuit; and
a bias generator configured to generate the first bias and the second bias, supply the first bias to the first distributed voltage-controlled oscillator and the second bias to the second distributed voltage-controlled oscillator, generate the optimum bias, and supply the optimum bias to the core circuit;
wherein the optimum bias is configured to be adjusted on a basis of a current value of the first current monitor and a current value monitored by the second current monitor at a time at which the levels of the oscillation frequencies are reversed; and
wherein a unit cell of the first distributed voltage-controlled oscillator, a unit cell of the second distributed voltage-controlled oscillator, and a unit cell of the core circuit are identical in transistor size.

10. A semiconductor integrated circuit comprising:
the voltage setting circuit according to claim 9; and
the core circuit connected to the voltage setting circuit.

11. The semiconductor integrated circuit according to claim 10, wherein the voltage setting circuit and the core circuit are disposed on a same chip.

12. The semiconductor integrated circuit according to claim 10, wherein:
the voltage setting circuit is disposed on a first substrate;
the core circuit is disposed on a second substrate; and
a decoupling capacitor is connected to each of power supply voltage terminals of the first distributed voltage-controlled oscillator and the second distributed voltage-controlled oscillator, a power supply voltage terminal of the core circuit, and a wiring line through which the optimum bias is supplied from the bias generator to the core circuit.

13. A voltage setting method for setting an optimum bias in a core circuit in a semiconductor integrated circuit, wherein the semiconductor integrated circuit comprises a first distributed voltage-controlled oscillator, a second distributed voltage-controlled oscillator, the core circuit, a plurality of current monitors, a frequency comparator, and a frequency determination circuit, the voltage setting method comprising:
supplying a first bias to the first distributed voltage-controlled oscillator;
supplying a second bias to the second distributed voltage-controlled oscillator, the second bias having a predetermined voltage difference from the first bias;
comparing an oscillation frequency of the first distributed voltage-controlled oscillator and an oscillation frequency of the second distributed voltage-controlled oscillator;
in response to a determination that the oscillation frequency of the first distributed voltage-controlled oscillator is higher than the oscillation frequency of the second distributed voltage-controlled oscillator, increasing or decreasing the first bias and the second bias by a predetermined voltage;
supplying the increased or decreased first bias and the increased or decreased second bias to the first distributed voltage-controlled oscillator and the second distributed voltage-controlled oscillator, respectively;
comparing the oscillation frequency of the first distributed voltage-controlled oscillator and the oscillation frequency of the second distributed voltage-controlled oscillator at the increased or decreased first bias and the increased or decreased second bias, respectively;
at a time at which levels of the oscillation frequency of the first distributed voltage-controlled oscillator and the oscillation frequency of the second distributed voltage-controlled oscillator at the increased or decreased first bias and the increased or decreased second bias are reversed, monitoring a current flowing in the first distributed voltage-controlled oscillator and a current flowing in the second distributed voltage-controlled oscillator; and
determining the optimum bias to be supplied to the core circuit to cause a current value determined based on the monitored current to flow into the core circuit.

14. The voltage setting method according to claim 13, further comprising:
setting the optimum bias in the core circuit; and
after setting the optimum bias in the core circuit, turning off power supplies to the first distributed voltage-controlled oscillator, the second distributed voltage-controlled oscillator, the frequency comparator, and the frequency determination circuit.

15. The voltage setting method according to claim 13, wherein the voltage setting circuit and the core circuit are disposed on a same chip.

16. The voltage setting method according to claim 13, wherein:
the voltage setting circuit is disposed on a first substrate;
the core circuit is disposed on a second substrate; and
a decoupling capacitor is connected to each of power supply voltage terminals of the first distributed voltage-controlled oscillator and the second distributed voltage-controlled oscillator, a power supply voltage terminal of the core circuit, and a wiring line through which the optimum bias is supplied from a bias generator to the core circuit.

* * * * *